United States Patent
Jensen et al.

(10) Patent No.: US 10,084,283 B1
(45) Date of Patent: Sep. 25, 2018

(54) SYSTEMS AND METHODS USING OPTICAL AMPLIFIERS

(71) Applicants: David W. Jensen, Marion, IA (US); Steven E. Koenck, Cedar Rapids, IA (US); Robert G. Brown, Hyattsville, MD (US); Matilda G. Livadaru, Marion, IA (US)

(72) Inventors: David W. Jensen, Marion, IA (US); Steven E. Koenck, Cedar Rapids, IA (US); Robert G. Brown, Hyattsville, MD (US); Matilda G. Livadaru, Marion, IA (US)

(73) Assignee: ROCKWELL COLLINS, INC., Cedar Rapids, IA (US)

(*) Notice: Subject to any disclaimer, the term of this patent is extended or adjusted under 35 U.S.C. 154(b) by 102 days.

(21) Appl. No.: 14/796,607

(22) Filed: Jul. 10, 2015

(51) Int. Cl.
*H01S 5/10* (2006.01)
*H01S 5/00* (2006.01)
*H01S 5/40* (2006.01)
*H01S 5/50* (2006.01)
*G02B 27/01* (2006.01)

(52) U.S. Cl.
CPC .......... *H01S 5/105* (2013.01); *G02B 27/0172* (2013.01); *G02B 27/0189* (2013.01); *H01S 5/005* (2013.01); *H01S 5/4025* (2013.01); *H01S 5/5027* (2013.01)

(58) Field of Classification Search
CPC ..... H01S 5/105; H01S 5/1078; H01S 2301/02
See application file for complete search history.

(56) References Cited

U.S. PATENT DOCUMENTS

| | | | |
|---|---|---|---|
| 6,366,598 B1* | 4/2002 | Nichols | H01S 5/12 372/102 |
| 6,411,418 B1* | 6/2002 | Deri | H04J 14/0282 398/182 |
| 8,958,141 B1 | 2/2015 | Brown | |
| 2008/0232754 A1* | 9/2008 | Fattal et al. | B82Y 20/00 385/129 |
| 2010/0246613 A1* | 9/2010 | Hasegawa | B82Y 20/00 372/20 |
| 2013/0215496 A1* | 8/2013 | Ban | H01L 27/3227 359/345 |

OTHER PUBLICATIONS

U.S. Appl. No. 14/663,687, filed Mar. 20, 2015, Robert G. Brown et al.

(Continued)

*Primary Examiner* — Eric L Bolda
(74) *Attorney, Agent, or Firm* — Donna P. Suchy; Daniel M. Barbieri

(57) ABSTRACT

An optical system is described. The optical system has an optical amplifier array. The optical amplifier array has an array of optical amplifiers. Each optical amplifier has an optical amplifier region including a semiconductor active region having a direct electronic band gap with a conduction band edge. The semiconductor active region is embedded within a photonic crystal having an electromagnetic band gap having photon energies overlapping the energy of the conduction band edge of the electronic band gap such that spontaneous emission of photons in the semiconductor active region is suppressed.

11 Claims, 6 Drawing Sheets

(56) References Cited

OTHER PUBLICATIONS

U.S. Appl. No. 14/732,277, filed Jun. 5, 2015, Koenck, Steve E. et al.
Aieta, Francesco et al. "Multiwavelength achromatic metasurfaces by dispersive phase compensation", Science, Mar. 20, 2015, Published online Feb. 19, 2015, [DOI:10.1126/science.aaa2494], downloaded from www.sciencemag.org on Feb. 19, 2015, 8 pages.
Yablonovitch, Eli, "Inhibited Spontaneous Emission in Solid-State Physics and Electronics", Physical Review Letters, May 18, 1987, pp. 2059-2062, vol. 58, No. 20.

\* cited by examiner

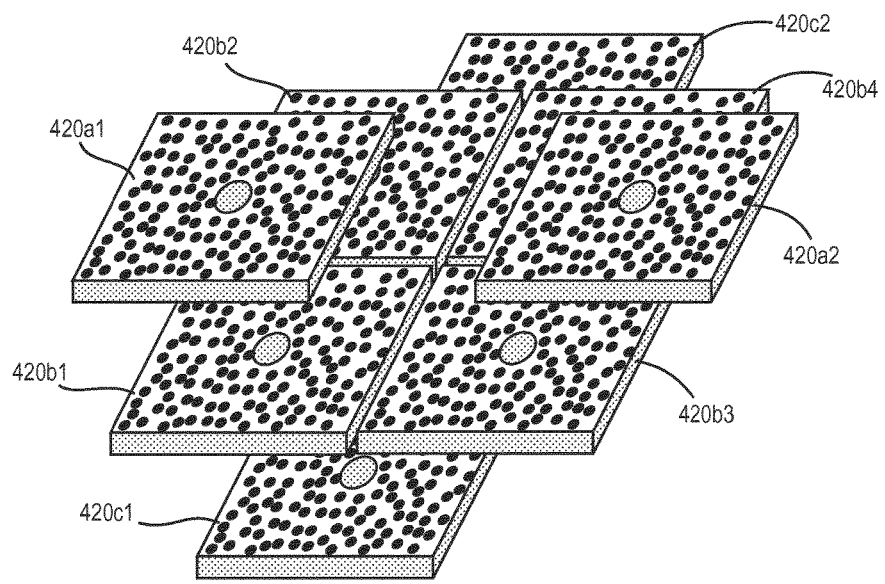
FIG. 5
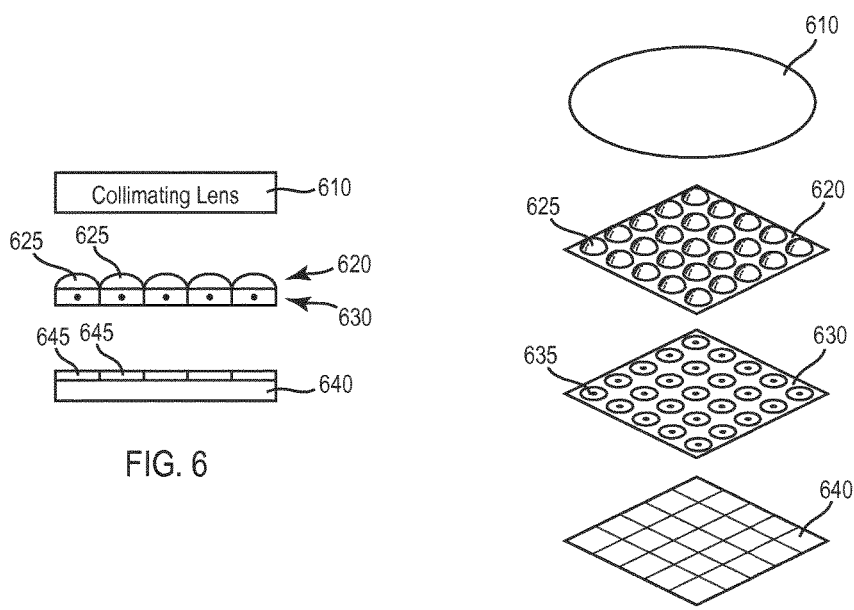
FIG. 6
FIG. 7

SYSTEMS AND METHODS USING OPTICAL AMPLIFIERS

BACKGROUND

The inventive concepts disclosed herein relate to a low noise optical amplifier for low light detection, and to optical systems employing such a low noise optical amplifier.

Low light level imaging is important for applications ranging from photography to night vision. One example application is in helmet mounted displays, such that may be deployed on a helmet for a pilot operating an aircraft. Other applications include astronomical imaging. Low light levels may occur, for example, for night time imaging under overcast conditions.

Light detection systems include imaging devices that may employ focal plane array (FPA) detectors. Typically, an FPA will have very many pixels, each pixel appropriate for separately detecting a plurality of impinging photons. Light detectors and FPAs, however, eventually are unable to operate in ultra-low light conditions.

In low light level imaging conditions, only a few photons per pixel may arrive each frame-time. In this case, the imaging quality in an optical imaging system may be very grainy or noisy, which can render images taken at night unusable. Dark current and digital readout circuitry create noise that exceeds the minimal signal created by the few photons. In the lowest light level conditions, so few photons may arrive that no image is captured at all.

SUMMARY

In one aspect, embodiments of the inventive concepts disclosed herein are directed to an optical switch. The optical switch includes a plurality of intermediary switchable optical amplifiers arranged between optical inputs and optical outputs. The intermediary switchable optical amplifiers when switched on amplify light from the optical inputs. Each of the intermediary switchable optical amplifiers include an optical amplifier region including a semiconductor active region having a direct electronic band gap with a conduction band edge. The semiconductor active region is embedded within a photonic crystal having an electromagnetic band gap having photon energies overlapping the energy of the conduction band edge of the electronic band gap such that spontaneous emission of photons in the semiconductor active region is suppressed.

In some embodiments, the optical switch has a plurality of input switchable optical amplifiers arranged between the optical inputs and the intermediary switchable optical amplifiers. The input switchable optical amplifiers when switched on amplify light from the optical inputs and provide light to the intermediary switchable optical amplifiers.

In some embodiments, the optical switch has a plurality of output switchable optical amplifiers arranged between the optical outputs and the intermediary switchable optical amplifiers. The output switchable optical amplifiers when switched on amplify light from the intermediary switchable optical amplifiers and provide light to the optical outputs.

In some embodiments, the plurality of input switchable optical amplifiers, the intermediary switchable optical amplifiers, and the plurality of output switchable optical amplifiers are arranged in a crossbar arrangement.

In some embodiments, the plurality of input switchable optical amplifiers, the intermediary switchable optical amplifiers, and the plurality of output switchable optical amplifiers are arranged in a stacked arrangement with the input switchable optical amplifiers disposed on a side of the intermediary switchable optical amplifiers opposite to a side the output switchable optical amplifiers are disposed.

In a further aspect, embodiments of the inventive concepts disclosed herein are directed to an optical system. The optical system has an optical amplifier. The optical amplifier array includes an array of optical amplifiers. Each optical amplifier has an optical amplifier region including a semiconductor active region having a direct electronic band gap with a conduction band edge. The semiconductor active region is embedded within a photonic crystal having an electromagnetic band gap having photon energies overlapping the energy of the conduction band edge of the electronic band gap such that spontaneous emission of photons in the semiconductor active region is suppressed.

In some embodiments, the optical system includes a collimating lens which is arranged to collect, collimate and direct light toward the optical amplifier array, such that the array of optical amplifiers amplify light from the collimating lens.

In some embodiments, the collimating lens is a flat lens.

In some embodiments, the optical system includes a microlens array including a plurality of microlenses arranged between the collimating lens and the array of optical amplifiers. The microlenses are arranged to focus light from the collimating lens to respective of the optical amplifiers.

In some embodiments, the optical system includes an optical detector array including an array of optical detector elements. The array of optical amplifiers is arranged to direct amplified light to respective of the optical detector elements.

In some embodiments, the optical detector array is one of a CMOS sensor or a CCD sensor array.

In some embodiments, the optical system is a digital night vision system.

In some embodiments, the optical system is night vision glasses, and the optical amplifier array includes a first optical amplifier array and a second optical amplifier array. The night vision glasses include a first image amplifier unit including the first optical amplifier array, and a second image amplifier unit including the second optical amplifier array.

In some embodiments, the night vision glasses further comprise a power source arranged to provide power to the first optical amplifier array and the second optical amplifier array.

In some embodiments, the optical display system is a light emitting diode (LED) system, wherein the display optics comprises an LED.

In a further aspect, embodiments of the inventive concepts disclosed herein are directed to an optical display system. The optical display system includes an optical amplifier array and display optics. The optical amplifier array includes an array of optical amplifiers. Each optical amplifier has an optical amplifier region including a semiconductor active region having a direct electronic band gap with a conduction band edge. The semiconductor active region is embedded within a photonic crystal having an electromagnetic band gap having photon energies overlapping the energy of the conduction band edge of the electronic band gap such that spontaneous emission of photons in the semiconductor active region is suppressed. The display optics are arranged to provide an image to a display or the eye of an observer. The optical amplifier array is arranged in an optical path of the optical display system to amplify light.

In some embodiments, the optical display system is a head up display (HUD).

In some embodiments, the optical display system is a projection system.

In some embodiments, the optical display system is a helmet mounted display (HMD).

In a further aspect, embodiments of the inventive concepts disclosed herein are directed to a method of amplifying light by an optical amplifier. The method includes receiving input light and amplifying the input light. The input light is received by an optical amplifier region of the optical amplifier. The optical amplifier region comprising a semiconductor active region having a direct electronic band gap with a conduction band edge. The semiconductor active region is embedded within a photonic crystal having an electromagnetic band gap having photon energies overlapping the energy of the conduction band edge of the electronic band gap such that spontaneous emission of photons in the semiconductor active region is suppressed. The input light is amplified via the optical amplifier to provide amplified output light.

BRIEF DESCRIPTION OF THE DRAWINGS

FIG. 5 illustrates a stacked arrangement of optical amplifiers of the optical switch of FIG. 4.

FIG. 6 illustrates a digital night vision system according to an embodiment of the inventive concepts disclosed herein.

FIG. 7 is an exploded view of the digital night vision system of FIG. 6.

DETAILED DESCRIPTION

Figure 1:
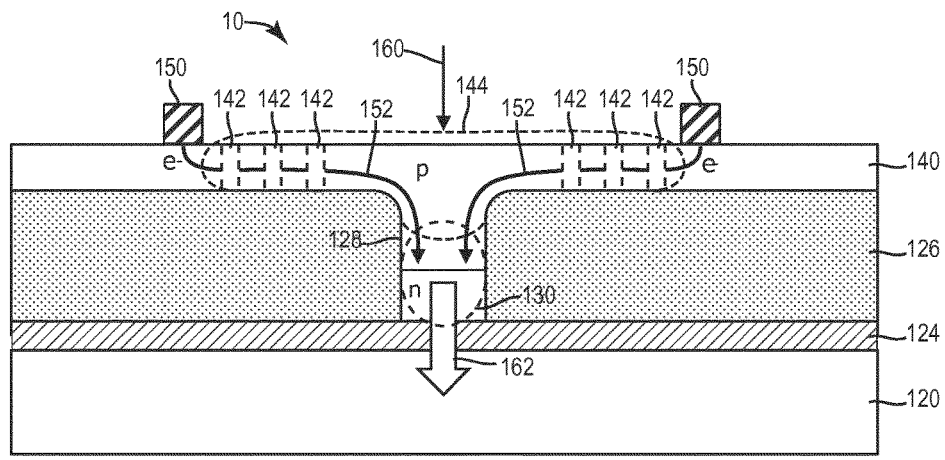
FIG. 1 is a cross-sectional view of an optical amplifier according to an embodiment of the inventive concepts disclosed herein.

A substantially improved optical imaging system is possible by amplifying those few photon arrivals per frame time per pixel by a low (near-zero) noise amplifier. Such a low noise amplifier has been described in U.S. application Ser. No. 14/663,687, entitled "LOW NOISE OPTICAL PRE-AMPLIFIER FOR ULTRA-LOW-LIGHT DETECTORS AND FPAS", filed Mar. 20, 2015, which is incorporated herein in its entirety. In particular, such a low noise amplifier may be provided by disposing a semiconductor amplifier within a photonic crystal, which has a photonic band gap. By appropriately aligning the energy of the conduction band edge of the electronic band gap of the semiconductor amplifier with the photon energy of forbidden wavelengths within the photonic band gap, the spontaneous emissions of photons in the semiconductor amplifier may be strongly suppressed. Thus, the noise due to spontaneous emissions of photons in the semiconductor amplifier within the amplification process may be strongly suppressed.

The use of a photonic crystal may suppress the spontaneous emission in a semiconductor, which may spontaneously emit a photon from an electronic transition from the conduction band to the valence band. Photonic crystals are periodic dielectric structures that have an electromagnetic band gap that forbids propagation of a certain frequency range of electromagnetic radiation. In particular, spontaneous emission can be suppressed by appropriate alignment of the photonic crystal band gap with respect to an electronic conduction band edge of a semiconductor material [E. Yablonovitch, '*Inhibited Spontaneous Emission in Solid-State Physics and Electronics*', Phys. Rev. Letts, 58, 2059 (1987)]. If a photonic crystal with a periodic dielectric structure has an electromagnetic band-gap that overlaps the electronic conduction band edge of the semiconductor material embedded in the photonic crystal, then spontaneous emission of photons in the semiconductor material can be suppressed.

Optical amplification in the semiconductor material of the semiconductor active region of the amplifier may be provided by electrically injecting (pumping) the semiconductor band edge of the semiconductor material suitable for amplifying an incoming photon. This optical amplification produces many photons from each single photon impinging on the amplifier. Appropriate semiconductor materials for optically amplifying photons impinging on the amplifier may be selected from semiconductor materials appropriate for laser light amplification (although lasing does not occur in the semiconductor material of the amplifier). For example, the semiconductor material of the semiconductor active region may be a Group III-V material. Alternatively, the semiconductor material may be a Group IV or Group II-VI material.

Examples are provided below of appropriate semiconductor materials for the active material of a p-n junction for different colors/wavelengths of light:
  Blue: GaN or InGaN;
  Green: GaN, InGaN or AlGaAs;
  Red: InGaP or AlInGaP;
  1064 nm and 1550 nm: InGaAs.

Examples of stacks for III-V systems for a multiple quantum well (MQW) structure are provided below for different colors/wavelengths of light:
  Blue: GaN/InGaN QW stack;
  Green: GaN/InGaN QW stack;
  Red: InGaP/InAlGaP QW stack;
  1064 nm: InGaAs/AlGaAs QW stack; and
  1550 nm: InGaAs/InP QW stack.

P-N Junction Optical Amplifier

Figure 2:
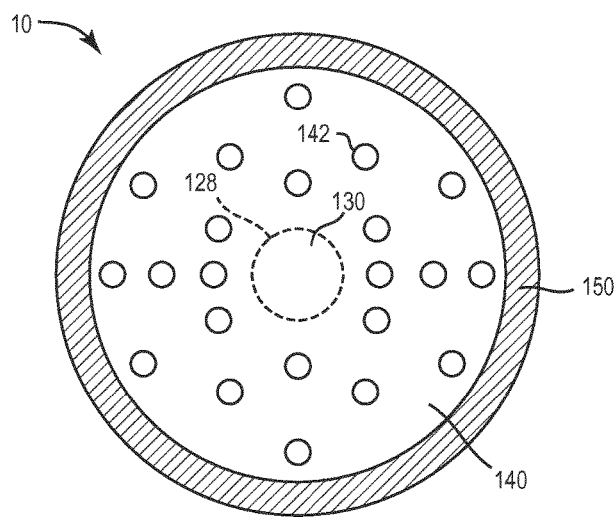
FIG. 2 is a top view of the optical amplifier of FIG. 1.

FIGS. 1 and 2 illustrate an optical amplifier 10 according to inventive concepts disclosed herein, where FIG. 1 is a side cross-sectional view and FIG. 2 is a top view. The optical amplifier 10 may include a substrate 120, a bottom electrode 124, an insulating layer 126, a semiconductor layer 140, and a top electrode 150.

The bottom electrode 124 is disposed on the substrate 120 may be formed of a material transparent to visible light, such as indium tin oxide (ITO), for example.

The insulating layer 126 is disposed over the bottom electrode 124. The insulating layer 126 may be any appropriate insulator, such as silicon dioxide, or silicon nitride, for example. A through hole 128 is disposed in the insulating layer 126 and exposes the top of the bottom electrode 124.

The semiconductor layer 140 is formed over the insulating layer 126 and in the through hole 128. The semiconductor layer 140 may be a Group IV, Group II-VI, or a Group III-V material, for example. Appropriate Group III-V materials include, for example, AlGaAs, AlGaInP, GaN, InGaN, InGaP, and InGaAs. The semiconductor layer 140 may be doped to provide a semiconductor active region 130, such as a p-n junction, in the through hole 128.

The semiconductor layer 140 may further include holes 142 formed in a pattern in a top portion of the semiconductor layer 140. The holes 142 are formed in a pattern so that a region of the semiconductor layer 140 functions as a photonic crystal 144.

The semiconductor active region 130 has an electronic band edge having a predetermined energy. The photonic crystal 144 has a hole size and spacing, and a dielectric constant to provide an electromagnetic band gap having a range of photon energies. Photons having energies falling with the electromagnetic band gap are forbidden to propagate within the photonic crystal 144. The photonic crystal 144 has a hole size and spacing, and a dielectric constant to provide an electromagnetic band gap such that the electromagnetic band gap has photon energies that overlap the energy of the conduction band edge of the direct electronic band gap of the semiconductor active region 130. In this case, spontaneous emission of a photon based on an electronic transition from the conduction band edge to the valence band edge is prohibited.

The top electrode 150 is formed over the semiconductor layer 140. The top electrode 150 may be formed of a material transparent to visible light, such as indium tin oxide (ITO), for example. The top and bottom electrodes 124, 150 electrically contact the semiconductor layer 140. An appropriate voltage is applied to the optical amplifier 10 through electrodes 124 and 150 to inject current 152 and pump the semiconductor conduction band edge of the semiconductor active region 130. The current 152 flow is shown in FIG. 1 from the top electrode 150 to the semiconductor active region 130. The optical amplifier 10 amplifies incoming electromagnetic radiation 160 impinging on the semiconductor active region 130 into outgoing radiation 162, which is directed to the substrate 120.

The substrate 120 may be an optically clear passive substrate which is transparent to the outgoing radiation 164 of interest. Alternatively, or in addition, the substrate 120 may comprise an image sensor, which detects the outgoing radiation 162. The image sensor may be, for example, a silicon CMOS (complementary metal oxide semiconductor) or charge coupled device (CCD) sensor.

MQW Optical Amplifier

Figure 3:
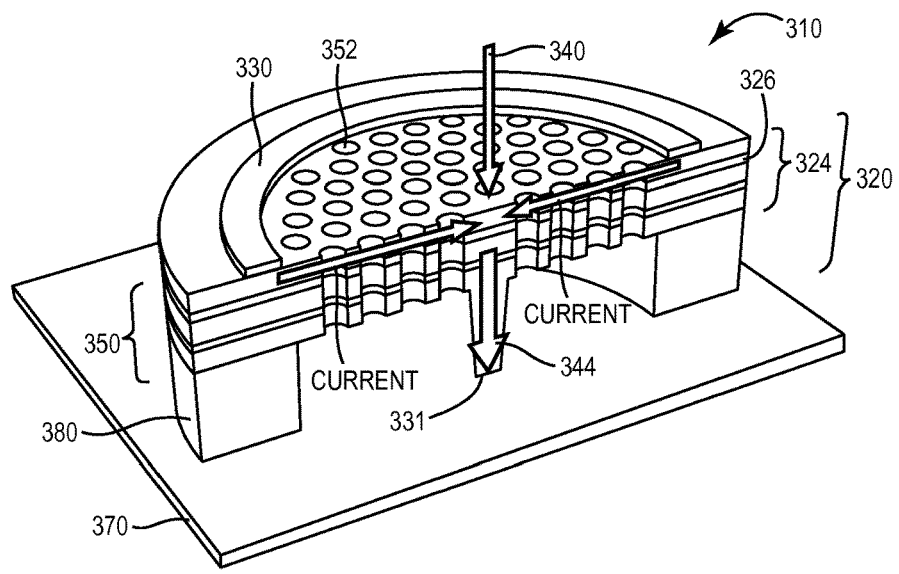
FIG. 3 is a schematic illustrating an optical amplifier according to another embodiment of the inventive concepts disclosed herein.

FIG. 3 is a schematic illustrating an optical detector system 310 with an optical amplifier 320 and an optical detector 370 according to an embodiment of the inventive concepts disclosed herein, where the optical amplifier region 324 of the optical amplifier 320 has a MQW structure. The optical amplifier region 324 has a semiconductor active region 326, comprising layers within the MQW where electronic and photonic confinement occur. The optical amplifier 320 may also include current injecting electrodes 330, which function to inject current and pump the semiconductor band edge of the semiconductor active regions 326 within the MQW to allow for amplification of incoming electromagnetic radiation 340 impinging on the semiconductor active region 326 into outgoing radiation 344, which is directed to the optical detector 370.

The optical amplifier 320 further comprises a photonic crystal 350, which is arranged within the semiconductor active region 326. In FIG. 3, the photonic crystal 350 has an array of holes 352, and a defect in the center where there is a lack of a hole. The defect may provide collimation and waveguide direction for photons of the outgoing radiation 344. The semiconductor active region 326 is embedded within the photonic crystal 350, and in FIG. 3 the semiconductor active region 326 is a part of the photonic crystal 350.

The semiconductor active region 326 is formed of a semiconductor material that has an electronic band gap having a desired energy. Typical materials for a MQW structure are semiconductor heterojunctions formed of one or more of: InAs, InGaAs, GaAs, AlGaAs, GaN, InGaN, InGaP, InAlGaP and InP. The photonic crystal 350 has a hole size and spacing, and a dielectric constant to provide an electromagnetic band gap having photon energies. Photons having energies falling with the electromagnetic band gap are forbidden to propagate within the photonic crystal 350. The photonic crystal 350 has a predetermined pattern of hole sizes and spacings, and a dielectric constant to provide an electromagnetic band gap such that the electromagnetic band gap has photon energies that overlap the energy of the conduction band edge of the electronic band gap such that spontaneous emission of photons in the semiconductor active region 326 is suppressed.

The outgoing radiation 344, which has been optically amplified is detected by an optical detector 370. The optical detector 370 may be any appropriate optical detector, such as an avalanche photodiode, or photomultiplier, for example where the amplified radiation is detected and converted into photo-current. Dielectric spacers 380 separate the optical detector from the optical amplifier 320. An electrical contact 331 provides a return path for the pumping current.

Figure 4:
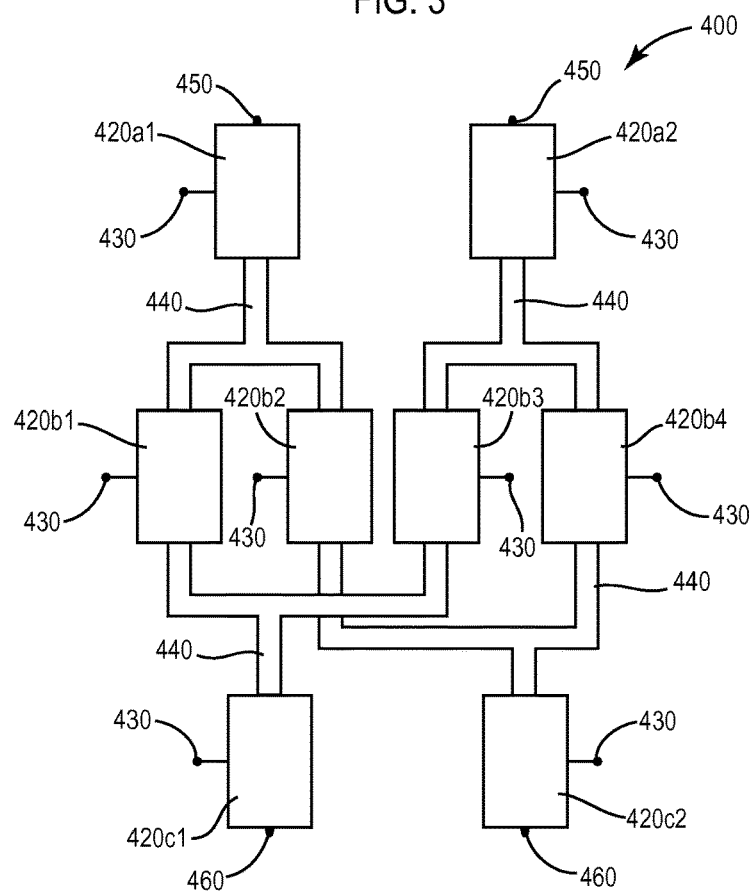
FIG. 4 is a schematic illustrating an optical switch according to an embodiment of the inventive concepts disclosed herein.

FIG. 4 is a schematic illustrating an optical switch 400 with optical amplifiers 420 (420a1, 420a2, 420b1, 420b2, 420b3, 420b4, 420c1 and 420c2) according to an embodiment of the inventive concepts disclosed herein. The optical amplifiers may have the structure of optical amplifier 10 of FIG. 1 or optical amplifier 320 of FIG. 3, for example. The optical switch 400 further includes optical waveguides 440 optically connecting the optical amplifiers 420 such that light may be passed between the optical amplifiers 420. As an alternative to waveguides 440, the optical amplifiers may be connected via lightpaths via diffusion or integrated lenses. The optical switch 400 further includes signal inputs 430 to allow the optical amplifiers 420 to be switched on and off. Each of the optical amplifiers 420 has a respective signal input 430. Electrical signals may be applied selectively to the optical amplifiers 420 to selectively switch on the optical amplifiers so that the switched on optical amplifiers 420 provide an optical gain to incoming photons. An electrical signal applied to the signal input 430 of one of the optical amplifiers biases the current injecting electrodes (330 in FIG. 3 or 150 in FIG. 1) to provide that the optical amplifier is on for an ON signal input, and biases the current injecting electrodes (330 in FIG. 3 or 150 in FIG. 1) to provide that the optical amplifier is off for an OFF signal input. Thus, the optical switch 400 may have its optical amplifiers 420 selectively switched on or off according to the electrical signal applied to the signal inputs 430.

FIG. 4 illustrates an optical switch 400 with a 2×2 crossbar arrangement. The two input optical amplifiers 420a1 and 420a2 each have an optical input 450 for receiving input light. The two output optical amplifiers 420c1 and 420c2 each have an optical output 460 for receiving output light from a respective output optical amplifier. The optical switch further has four intermediary optical amplifiers 420b1, 420b2, 420b3 and 420b4. One of the input optical amplifiers 420a1 is connected via optical waveguides 440 to two of the intermediary optical amplifiers 420b1 and 420b2, while the other input optical amplifier 420a2 is connected via optical waveguides 440 to the other two of the intermediary optical amplifiers 420b3 and 420b4. The intermediary optical amplifiers are connected to output optical amplifiers 420c1 and 420c2 in a crossbar fashion. Specifically, intermediary optical amplifiers 420b1 and 420b3 are connect to output optical amplifier 420c1, while intermediary optical amplifiers 420b2 and 420b4 are connect to output optical amplifier 420c2.

The crossbar arrangement shown in FIG. 4 allows for the input optical amplifiers 420a1, 420a2 to be selectively optically connected to the output optical amplifier 420c1 and/or the output optical amplifier 420c2 according to the electrical signals applied to the signal inputs 430 of the intermediary optical amplifiers 420b1, 420b2, 420b3 and 420b4. For example, by applying electrical signals such that the intermediary optical amplifiers 420b1 is on, but the intermediary optical amplifiers 420b2 is off, the input optical amplifier 420a1 is optically connected to the output optical amplifier 420c1, but not the output optical amplifier 420c2. Similarly, by applying electrical signals such that the intermediary optical amplifiers 420b3 is on, but the intermediary optical amplifiers 420b4 is off, the input optical amplifier 420a2 is optically connected to the output optical amplifier 420c1, but not the output optical amplifier 420c2.

The 2×2 crossbar switch 400 may provide a building block for larger size switches. In this regard, a plurality of crossbar switches 400 may be arranged and interconnected as a larger switch.

The switch 400, which is based on optical amplifiers, provides an optical gain through its optical amplifiers. This eliminates the need for conversion between electrical and optical signals. This optical gain compensates for losses and enables the use of an optical waveguide between switching paths.

FIG. 5 illustrates a stacked arrangement of the optical amplifiers 420 of the optical switch of FIG. 4. The top stack includes the input optical amplifiers 420a1 and 420a2. An intermediary stack includes the intermediary optical amplifiers 420b1, 420b2, 420b3 and 420b4. The bottom stack includes the output optical amplifiers 420c1 and 420c2.

FIG. 6 illustrates a digital night vision system 600 according to an embodiment of the inventive concepts disclosed herein. FIG. 7 is an exploded view of the digital night vision system 600 of FIG. 6. The system 600 includes a collimating lens 610, a microlens array 620, an optical amplifier array 630, and an optical detector array 640.

The collimating lens 610 focuses the image scene onto the optical amplifier array 630. The collimating lens 610 may be a flat lens, for example, which aids in reducing the size of the digital night vision system 600. In this regard, the collimating lens may be a graded index (GRIN) lens, and/or a flat lens formed of a metamaterial. A metamaterial flat lens is disclosed, for example, in U.S. application Ser. No. 13/609,012, entitled "ULTRA-BROADBAND, PLASMONIC, HIGH-REFRACTIVE INDEX MATERIALS, UBHRI-GRIN-LENSES—AND OTHER OPTICAL COMPONENTS" filed on Sep. 10, 2012, which is incorporated by reference herein in its entirety. The flat lens could be an achromatic metasurface device demonstrated by the Federico Capasso group of Harvard University (see "Multiwavelength achromatic metasurfaces by dispersive phase compensation" by Aieta et al. in Science, Feb. 19, 2015). Instead of using several thick lenses in sequence, these flat lens perform the same focusing function in one extremely thin device.

The collimating lens 610 collects and collimates light, where the collimated light is directed to the microlens array 620. The microlens array 620 comprises an array of microlenses 625.

The optical amplifier array 630 comprises an array of optical amplifiers 635. The optical amplifiers 635 may have the structure of optical amplifier 10 of FIG. 1 or optical amplifier 320 of FIG. 3, for example. Each microlens 625 focuses light from the collimating lens 610 to a respective of the optical amplifiers 635, which amplify the light received. The microlenses 625 further focus light from the collimating lens 610 onto the optical amplifiers 635, which are the active amplifying region of the optical amplifier 630. Photons that would have impinged on non-active regions between the elements 635 of the optical amplifier 630 now impinge on active areas. This improves the sensitivity of the system for low light environments.

The optical detector array 640 comprises an array of optical detector elements 645. The optical amplifiers 635 of the optical amplifier array 630 direct amplified light to respective of the optical detector elements 645. The optical detector array 640 may be a focal plane array (FPA), and may be a complementary metal oxide silicon (CMOS) detector array or a charged coupled device (CCD) detector array, for example.

Figure 8:
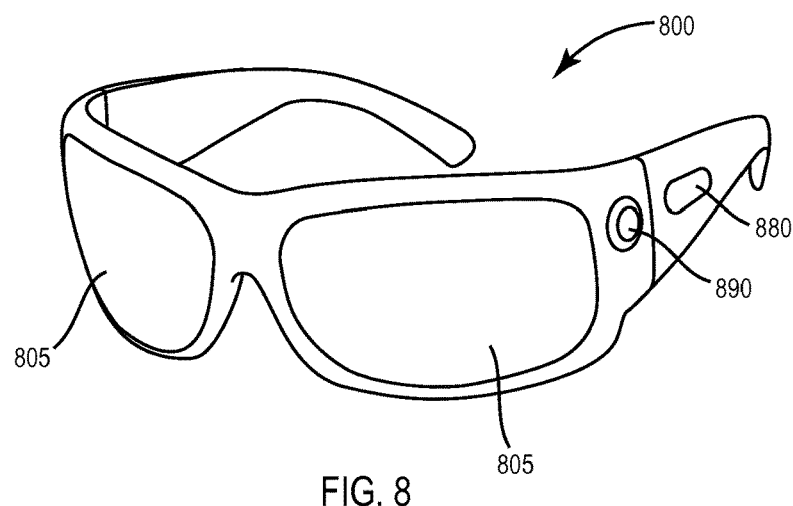
FIG. 8 illustrates night vision glasses according to an embodiment of the inventive concepts disclosed herein.

FIG. 8 illustrates night vision glasses 800 according to an embodiment of the inventive concepts disclosed herein. The night vision glasses 800 include two image amplifier units 805, a power source 880, and a control switch 890.

Figure 9:
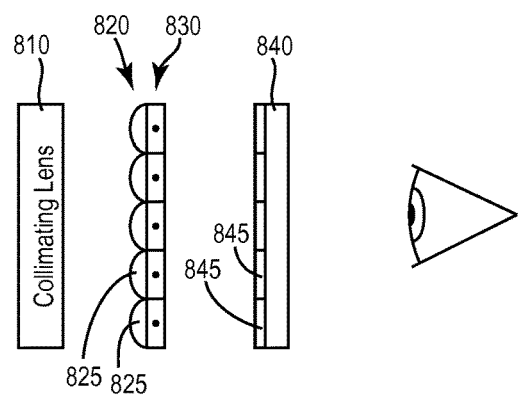
FIG. 9 illustrates an image amplifier unit of the night vision glasses of FIG. 8.

As shown in FIG. 9, each image amplifier unit 805 includes a collimating lens 810, a microlens array 820, an optical amplifier array 830, and an imaging lens 840.

The collimating lens 810 may be a flat lens, for example. In this regard, the collimating lens may be a graded index (GRIN) lens, and/or a flat lens formed of an achromatic metasurface device.

The collimating lens 810 collects and collimates light, where the collimated light is directed to the microlens array 820. The microlens array 820 comprises an array of microlenses 825. The microlenses 825 focus light from the collimating lens 810.

The optical amplifier array 830 comprises an array of optical amplifiers 835. The optical amplifiers 835 may have the structure of optical amplifier 10 of FIG. 1 or optical amplifier 320 of FIG. 3, for example. Each microlens 825 focuses light from the collimating lens 810 to a respective of the optical amplifiers 835, which amplify the light received.

The imaging lens 840 may be a flat lens, and may comprises an array of flat microlenses 845. The optical amplifiers 835 of the optical amplifier array 830 direct amplified light to respective of the microlenses 845. The microlenses 845 may each be a GRIN lens, and/or a flat lens formed of a metamaterial, for example. The imaging lens 840 comprising the array of flat microlenses 845 focuses the amplified light from the optical amplifiers 835 onto an eye of the user wearing the glasses 800.

Returning to FIG. 8, the power source 880 of the glasses 800, such as a small battery, provides power to the optical amplifiers 835 of the optical amplifier array 830. The control switch 890 of the glasses 800 controls the power provided to the optical amplifiers 835 of the optical amplifier array 830, and thus controls the voltage gain in the optical amplifiers 835 and the light intensity provided by the optical amplifiers 835. The control switch 890 may be a capacitive touch switch, for example.

Figure 10:
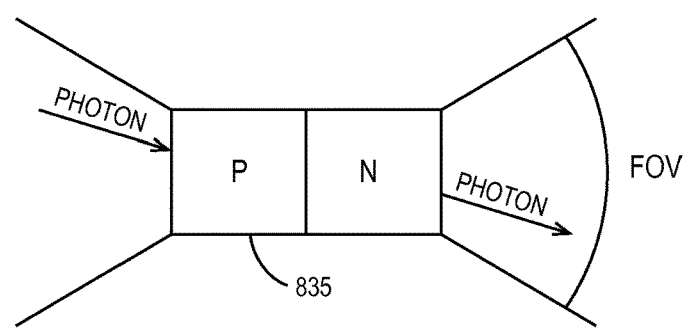
FIG. 10 is a schematic illustrating the field of view (FOV) for an optical amplifier according to an embodiment of the inventive concepts disclosed herein.

FIG. 10 is a schematic illustrating the field of view (FOV) for one of the optical amplifiers 835. The optical amplifier 835 has numerical aperture (NA) and FOV which is defined by the refractive index $n_1$ of the core material of the optical amplifier 835, and the effective refractive index $n_2$ of the hole region of the photonic crystal surrounding the core, $$FOV \cong 2 \sin^{-1}(NA) \cong 2 \sin^{-1}(\sqrt{n_1^2 - n_2^2})$$

The direction of the photon or ray of light from the optical amplifier 835 is preserved with the light amplification. Using $n_1$ and $n_2$ values in a typical range, $n_1$ equal to 3.08 and $n_2$ equal to 3.06, the optical amplifier 835 and night vision glasses would have a resultant FOV of 38°. Thus, disposing the image amplifier units 805 in a pair of glasses would result in low power requirement glasses, albeit with a limited FOV. Multiple layers of optical amplifier arrays 830 for each image amplifier unit 805 would provide additional gain.

Figure 11:
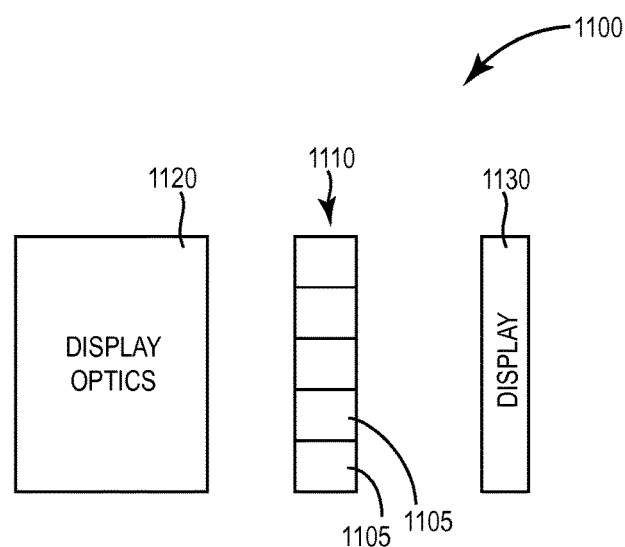
FIG. 11 is a schematic illustrating an optical display system according to an embodiment of the inventive concepts disclosed herein.

FIG. 11 is a schematic illustrates an optical display system 1100 according to an embodiment of the inventive concepts disclosed herein. The display system 1100 includes an optical amplifier array 1110, display optics 1120, and a display 1130.

Figure 12:
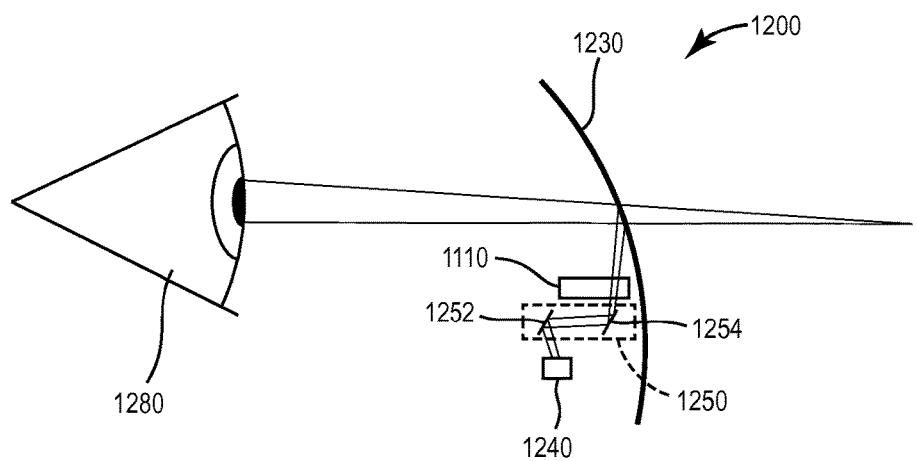
FIG. 12 is a schematic illustrating a head-up display (HUD) according to an embodiment of the inventive concepts disclosed herein.
Figure 13:
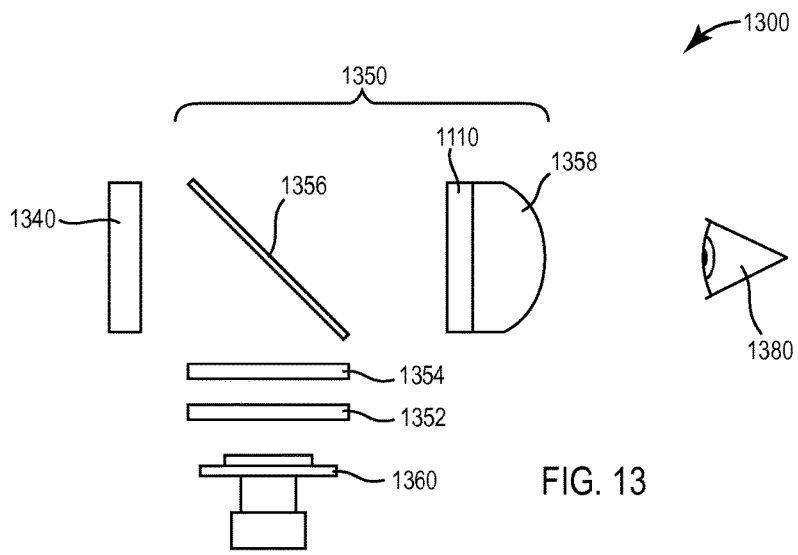
FIG. 13 is an exploded view of a helmet mounted display (HMD) according to an embodiment of the inventive concepts disclosed herein.
Figure 14:
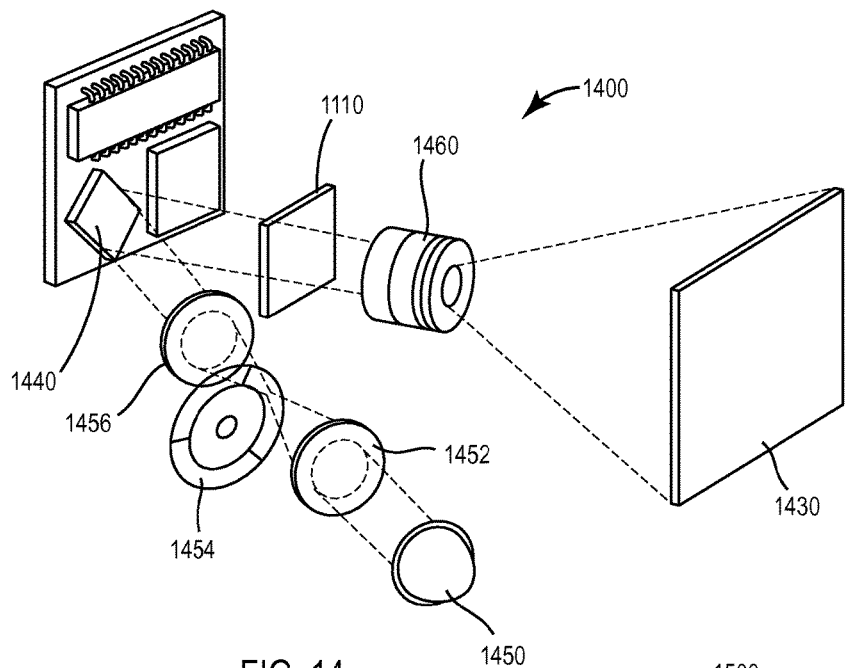
FIG. 14 is an exploded view of a projection system according to an embodiment of the inventive concepts disclosed herein.

The optical amplifier array 1110 is an array of optical amplifiers 1105. The optical amplifiers 1105 may have the structure of optical amplifier 10 of FIG. 1 or optical amplifier 320 of FIG. 3, for example. The optical amplifier array 1110 amplifies light from the display optics 1120 to provide a brighter image at the display 1130. FIGS. 12, 13 and 14 describe specific examples of the optical display system 1100 of FIG. 11. Alternatively, the optical amplifier array 1110 may provide amplified light directly to an eye without a display.

FIG. 12 illustrates a head-up display (HUD) 1200 as an example of an optical display system according to an embodiment of the inventive concepts disclosed herein. The HUD 1200 includes an image source 1240 which projects an image to imaging optics 1250, which in turn projects the image onto the display 1230, which may be viewed by a viewer 1280. The image source 1240 may be an LED array, for example. The imaging optics 1250 may include, for example, a fold mirror 1252 and an aspheric mirror 1254, to project an image from the image source 1240 onto the display 1230.

The HUD 1200 further includes an optical amplifier array 1110 arranged in the optical path of the system, such as for example, in the optical path between the imaging optics 1250 and the visor/display 1230. The optical amplifier array 1110 amplifies light from the imaging optics 1250 to provide a brighter image at the display 1230.

FIG. 13 is an exploded view of a helmet mounted display (HMD) 1300 as an example of an optical display system according to an embodiment of the inventive concepts disclosed herein. The HMD 1300 includes an image source 1340 which projects an image to imaging optics 1350, which projects the image which may be viewed by a viewer 1380. The image source 1340 may be illuminated with a light source 1360, which may be an LED light source, for example.

The imaging optics 1350 may include, for example, a pre-polarizer 1352, a Fresnel lens 1354, a polarizing beam splitter 1356 and an imaging lens 1358, to project an image from the image source 1340 which may be viewed by a viewer 1380. Light from the light source 1360 is pre-polarized by the pre-polarizer 1352, and imaged by the Fresnel lens 1354, and further directed to the polarizing beam splitter 1356 to the image source 1340. The light from the image source 1340 is directed via the polarizing beam splitter 1356 to the imaging lens 1358, which is imaged to be viewed by the viewer 1380.

The HMD 1300 further includes an optical amplifier array 1110 arranged in the optical path of the system, such as for example, in the optical path between the polarizing beam splitter 1356 and the imaging lens 1358. The optical amplifier array 1110 amplifies light from the image source 1340 to provide a brighter image to be viewed by the viewer 1380.

FIG. 14 is an exploded view of a projection system 1400 as an example of an optical display system according to an embodiment of the inventive concepts disclosed herein. The projection system 1400 includes an image source 1440 which provides an image to a projection lens 1460 which projects the image onto the display 1430. The image source 1440 may be digital micromirror device, for example, having an array of micromirrors which may be switched into or out of the optical path.

The projection system 1400 may further include a light source 1450 to provide light to the image source 1440. The projection system 1400, may include, for example, a condensing lens 1452, color filter 1454, and shaping lens 1456, between the light source 1450 and the image source 1440. The condensing lens 1452 directs light from the light source 1450 to the color filter 1454, which can be rotated to provide a desired colored light to the shaping lens 1456, which images the colored light onto the image source 1440.

The projection system 1400 further includes an optical amplifier array 1110 arranged in the optical path of the system, such as for example, in the optical path between the image source 1440 and the projection lens 1460. The optical amplifier array 1110 amplifies light from the image source 1440 to provide a brighter image at the display 1430.

Figure 15:
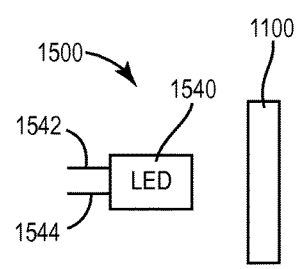
FIG. 15 is a schematic illustrating a light emitting diode (LED) system according to an embodiment of the inventive concepts disclosed herein.

FIG. 15 illustrates a light emitting diode (LED) system 1500 as an example of an optical display system according to an embodiment of the inventive concepts disclosed herein. The LED system 1500 includes an LED 1540 which generates light, and an optical array amplifier 1100. The optical amplifier array 1100 amplifies the light generated by the LED 1540, to increase the intensity of the light from the LED 1540.

The LED 1540 may further have a voltage electrode 1542 and a ground electrode 1544 to allow a voltage to be applied to the LED 1540. The optical amplifier array 1100 allows for bright light to be produced by the LED system 1500 without requiring high currents to be applied to the LED 1540 via the voltage electrode 1542 and the ground electrode 1544. Generally, in order to provide bright light from an LED, high currents must be applied to the LED. This high current and resulting heat reduce the lifetime of the LED. With the LED system 1500 of FIG. 15, with the optical array amplifier 1100, the optical array amplifier 1100 itself amplifies the light from the LED. This arrangement allows the LED 1540 to be driven at lower currents, while still providing bright light to be produced by the LED system 1500 overall. Thus, this arrangement would increase the life of LEDs used in high brightness applications, by requiring only lower current to be applied to the LED 1540.

The embodiments of the invention have been described in detail with particular reference to preferred embodiments thereof, but it will be understood by those skilled in the art that variations and modifications can be effected within the spirit and scope of the invention.

What is claimed is:

1. An optical switch, comprising:
a plurality of intermediary switchable optical amplifiers arranged between optical inputs and optical outputs, the intermediary switchable optical amplifiers when switched on amplifying light from the optical inputs;
each of the intermediary switchable optical amplifiers comprising an optical amplifier region comprising a semiconductor active region having a direct electronic band gap with a conduction band edge, and electrodes arranged to inject current into the semiconductor active region,
the semiconductor active region embedded within a photonic crystal having an electromagnetic band gap having photon energies overlapping the energy of the conduction band edge of the electronic band gap such that spontaneous emission of photons in the semiconductor active region is suppressed, the photonic crystal comprising a semiconductor material having a plurality of holes;
a plurality of input switchable optical amplifiers arranged between the optical inputs and the intermediary switchable optical amplifiers, the input switchable optical amplifiers when switched on amplifying light from the optical inputs and providing light to the intermediary switchable optical amplifiers; and
a plurality of output switchable optical amplifiers arranged between the optical outputs and the intermediary switchable optical amplifiers, the output switchable optical amplifiers when switched on amplifying light from the intermediary switchable optical amplifiers and providing light to the optical outputs.

2. The optical switch of claim 1, wherein the plurality of input switchable optical amplifiers, the intermediary switchable optical amplifiers, and the plurality of output switchable optical amplifiers are arranged in a crossbar arrangement.

3. The optical switch of claim 1, wherein the plurality of input switchable optical amplifiers, the intermediary switchable optical amplifiers, and the plurality of output switchable optical amplifiers are arranged in a stacked arrangement with the input switchable optical amplifiers disposed on a side of the intermediary switchable optical amplifiers opposite to a side the output switchable optical amplifiers are disposed.

4. An optical system, comprising:
an optical amplifier array comprising an array of optical amplifiers, each optical amplifier having an optical amplifier region comprising a semiconductor active region having a direct electronic band gap with a conduction band edge, and electrodes arranged to inject current into the semiconductor active region, the semiconductor active region embedded within a photonic crystal having an electromagnetic band gap having photon energies overlapping the energy of the conduction band edge of the electronic band gap such that spontaneous emission of photons in the semiconductor active region is suppressed, the photonic crystal comprising a semiconductor material having a plurality of holes; and
an optical detector array comprising an array of optical detector elements, the array of optical amplifiers arranged to direct amplified light to respective of the optical detector elements.

5. The optical system of claim 4, further comprising:
a collimating lens arranged to collect, collimate and direct light toward the optical amplifier array, such that the array of optical amplifiers amplify light from the collimating lens.

6. The optical system of claim 5, wherein the collimating lens is a flat lens.

7. The optical system of claim 5, further comprising:
a microlens array comprising a plurality of microlenses arranged between the collimating lens and the array of optical amplifiers, the microlenses arranged to focus light from the collimating lens to respective of the optical amplifiers.

8. The optical system of claim 4, wherein the optical detector array is one of a CMOS sensor or a CCD sensor array.

9. The optical system of claim 4, wherein the optical system is a digital night vision system.

10. The optical system of claim 4, wherein the optical system is night vision glasses, and wherein the optical amplifier array comprises a first optical amplifier array and a second optical amplifier array, wherein the night vision glasses comprise:
a first image amplifier unit comprising the first optical amplifier array, and a second image amplifier unit comprising the second optical amplifier array.

11. The optical system of claim 10, wherein the night vision glasses further comprise a power source arranged to provide power to the first optical amplifier array and the second optical amplifier array.

* * * * *